(12) United States Patent
Chen et al.

(10) Patent No.: US 11,101,798 B2
(45) Date of Patent: Aug. 24, 2021

(54) RANDOM BIT CELL USING P-TYPE TRANSISTORS

(71) Applicant: eMemory Technology Inc., Hsin-Chu (TW)

(72) Inventors: Ying-Je Chen, Hsinchu County (TW); Wein-Town Sun, Hsinchu County (TW); Wei-Ming Ku, Hsinchu County (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 16/830,296

(22) Filed: Mar. 26, 2020

(65) Prior Publication Data

US 2020/0327945 A1 Oct. 15, 2020

Related U.S. Application Data

(60) Provisional application No. 62/832,853, filed on Apr. 11, 2019.

(51) Int. Cl.
*G11C 11/16* (2006.01)
*H03K 19/00* (2006.01)
(Continued)

(52) U.S. Cl.
CPC ......... *H03K 19/0013* (2013.01); *G05F 3/262* (2013.01); *G11C 5/025* (2013.01); *G11C 7/06* (2013.01); *G11C 7/1051* (2013.01); *G11C 7/1084* (2013.01); *G11C 11/1673* (2013.01); *G11C 11/1675* (2013.01); *G11C 11/1697* (2013.01); *G11C 16/08* (2013.01); *G11C 16/14* (2013.01); *G11C 16/16* (2013.01);
(Continued)

(58) Field of Classification Search
CPC .. H03K 19/0013; H03K 3/356; H03K 17/162; H03K 17/6871; H03K 19/018528; H03K 19/0944; G05F 3/262; G05F 3/267; G11C 5/025; G11C 7/06; G11C 7/1051; G11C 7/1084; G11C 11/1673; G11C 11/1675; G11C 11/1697; G11C 16/08; G11C 16/14; G11C 16/16; G11C 16/24; G11C 16/26; H02M 3/07
See application file for complete search history.

(56) References Cited

U.S. PATENT DOCUMENTS 4,807,188 A * 2/1989 Casagrande ........... G11C 16/28
365/185.05
5,592,001 A * 1/1997 Asano .................. G11C 11/5621
257/316
(Continued)

*Primary Examiner* — Vanthu T Nguyen
(74) *Attorney, Agent, or Firm* — Winston Hsu

(57) ABSTRACT

A random bit cell includes a selection transistor, a first P-type transistor, and a second P-type transistor. The selection transistor has a first terminal coupled to a source line, a second terminal coupled to a common node, and a control terminal coupled to a word line. The first P-type transistor has a first terminal coupled to the common node, a second terminal coupled to a first bit line, and a floating gate. The second P-type transistor has a first terminal coupled to the common node, a second terminal coupled to a second bit line, and a floating gate. During an enroll operation, one of the first P-type transistor and the second P-type transistor is programmed by channel hot electron injection.

24 Claims, 8 Drawing Sheets

(51) Int. Cl.
  *H03K 17/16* (2006.01)
  *H03K 19/0185* (2006.01)
  *H03K 3/356* (2006.01)
  *H03K 19/0944* (2006.01)
  *G05F 3/26* (2006.01)
  *H02M 3/07* (2006.01)
  *H03K 17/687* (2006.01)
  *G11C 5/02* (2006.01)
  *G11C 7/06* (2006.01)
  *G11C 7/10* (2006.01)
  *G11C 16/08* (2006.01)
  *G11C 16/14* (2006.01)
  *G11C 16/24* (2006.01)
  *G11C 16/26* (2006.01)
  *G11C 16/16* (2006.01)

(52) U.S. Cl.
  CPC .............. *G11C 16/24* (2013.01); *G11C 16/26* (2013.01); *H02M 3/07* (2013.01); *H03K 3/356* (2013.01); *H03K 17/162* (2013.01); *H03K 17/6871* (2013.01); *H03K 19/018528* (2013.01); *H03K 19/0944* (2013.01); *G05F 3/267* (2013.01)

(56) References Cited

U.S. PATENT DOCUMENTS

| | | | |
|---|---|---|---|
| 7,768,059 B2 | 8/2010 | Chen | |
| 7,968,926 B2 * | 6/2011 | Huang | H01L 27/11521 257/300 |
| 9,691,476 B2 * | 6/2017 | Tatsumura | G11C 11/161 |
| 9,893,208 B2 * | 2/2018 | Horiuchi | H01L 29/7839 |
| 10,122,538 B2 | 11/2018 | Wu | |
| 10,262,746 B2 | 4/2019 | Chen | |
| 2018/0315460 A1 | 11/2018 | Chen | |
| 2019/0079878 A1 | 3/2019 | Chen | |

* cited by examiner

RANDOM BIT CELL USING P-TYPE TRANSISTORS

CROSS REFERENCE TO RELATED APPLICATIONS

This non-provisional application claims priority of U.S. provisional application No. 62/832,853, filed on Apr. 11, 2019, included herein by reference in its entirety.

BACKGROUND OF THE INVENTION

1. Field of the Invention

The Present invention is related to a random bit cell, and more particularly to a random bit cell using P-type transistors.

2. Description of the Prior Art

As electronic devices are applied to more and more fields, information security between electronic devices and within electronic devices has raised great concerns. Since reverse engineering has become automatable on chips and devices, physical and side-channel attacks have become much more affordable and powerful. Therefore, it is more and more difficult to prevent the electronic devices from being accessed by unauthorized personnel.

In prior art, a physical unclonable function (PUF) circuit may be applied to generate random numbers as security keys for protecting the system from physical attacks due to its intrinsic characteristics. For example, the static random access memory (SRAM) has been used to implement the physical unclonable function circuit for generating random numbers since the latch of each SRAM cell is strongly dependent on the initial charge status of the SRAM cell and the initial charge status of the SRAM cell is unpredictable and uncontrollable. However, since the random number stored by the latch of the SRAM cell is volatile, it has to be regenerated every time when the power is reset.

SUMMARY OF THE INVENTION

One embodiment of the present invention discloses a random bit cell. The random bit cell includes a selection transistor, a first P-type transistor, and a second P-type transistor.

The selection transistor has a first terminal coupled to a source line, a second terminal coupled to a common node, and a control terminal coupled to a word line. The first P-type transistor has a first terminal coupled to the common node, a second terminal coupled to a first bit line, and a floating gate. The second P-type transistor has a first terminal coupled to the common node, a second terminal coupled to a second bit line, and a floating gate.

During an enroll operation, one of the first P-type transistor and the second P-type transistor is programmed by channel hot electron (CHE) injection.

Another embodiment of the present invention discloses a random bit cell. The random bit cell includes a selection transistor, a first P-type transistor, a second P-type transistor, a first isolation transistor, and a second isolation transistor.

The selection transistor having a first terminal coupled to a source line, a second terminal coupled to a common node, and a control terminal coupled to a first word line. The first P-type transistor has a first terminal coupled to the common node, a second terminal, and a floating gate. The second P-type transistor has a first terminal coupled to the common node, a second terminal, and a floating gate. The first isolation transistor has a first terminal coupled to the second terminal of the first P-type transistor, a second terminal coupled to a first bit line, and a control terminal coupled to a second word line. The second isolation transistor has a first terminal coupled to the second terminal of the second P-type transistor, a second terminal coupled to a second bit line, and a control terminal coupled to the second word line. During an enroll operation, one of the first P-type transistor and the second P-type transistor is programmed by channel hot electron injection.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
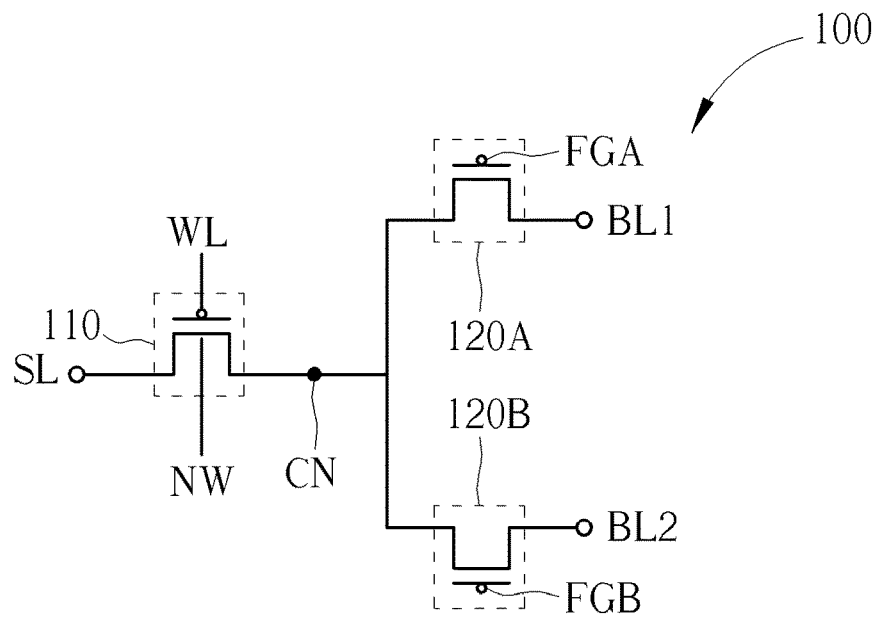
FIG. 1 shows a random bit cell according to one embodiment of the present invention.

FIG. 1 shows a random bit cell 100 according to one embodiment of the present invention. The random bit cell 100 includes a selection transistor 110, and P-type transistors 120A and 120B.

The selection transistor 110 has a first terminal coupled to a source line SL, a second terminal coupled to a common node CN, and a control terminal coupled to a word line WL. In FIG. 1, the selection transistor 110 can be a P-type transistor. In this case, the body terminal of the selection transistor 110 would be an N-well NW, and the N-well NW can be, for example but not limited to, coupled to the source line SL in some embodiments. However, in some other embodiments, the selection transistor 110 can be an N-type transistor according to the system requirement.

The P-type transistor 120A has a first terminal coupled to the common node CN, a second terminal coupled to a bit line BL1, and a floating gate FGA. Also, the P-type transistor 120B has a first terminal coupled to the common node CN, a second terminal coupled to a bit line BL2, and a floating gate FGB.

The random bit cell 100 can be used to generate a random bit by performing an enroll operation. In some embodiments, due to the uncontrollable variations between the P-type transistors 120A and 120B caused by the manufacturing process, one of the P-type transistors 120A and 120B may be programmed first during the enroll operation. Also, once the P-type transistor 120A or 120B is programmed, the programmed P-type transistor will prevent the other P-type transistor from being programmed. That is, after the enroll operation, only one of the P-type transistors 120A and 120B will be programmed. In this case, the programming states of the P-type transistors 120A and 120B can be used to represent the random bit. For example, if the P-type transistor 120A is programmed while the P-type transistor 120B is not programmed, then the random bit may be corresponding to "1". However, if the P-type transistor 120B is programmed while the P-type transistor 120A is not programmed, then the random bit may be corresponding to "0".

In some embodiments, the P-type transistors 120A and 120B can be programmed by the channel hot electron (CHE) injection. For example, during the enroll operation, the source line SL can be at a program voltage while the word line WL, the bit lines BL1 and BL2 can be at a reference voltage. In addition, the floating gates FGA and FGB of the P-type transistors 120A and 120B can also be coupled to the program voltage. In some embodiment, the program voltage can be greater than the reference voltage. For example, the program voltage can be 8V, and the reference voltage can be 0V.

In this case, the selection transistor 110 can be turned on. However, if the P-type transistors 120A and 120B are not programmed before, the resistance of the P-type transistors 120A and 120B would be rather high. Therefore, the voltage of the common node CN will be raised to a voltage close to the program voltage. In this case, due to the variations between P-type transistors 120A and 120B caused during the manufacturing process, one of the P-type transistors 120A and 120B may be more inclined to induce the channel hot electron injection, and thus will be programmed first. Once one of the P-type transistors 120A and 120B is programmed, that is, once the electrons are injected to the floating gate of one of the P-type transistors 120A or 120B, the resistance of the programmed P-type transistor will decrease quickly and may become similar to the turn-on resistance of the selection transistor 110. Consequently, the voltage of the common node CN will decrease, preventing the other P-type transistor from being programmed.

Since the selection transistor 110 and the P-type transistors 120A and 120B adopted in the random bit cell 100 can be manufactured by the regular processes used by the memory cells, the random bit cell 100 can be implemented flexibly and can even be embedded with the memory device.

Figure 2:
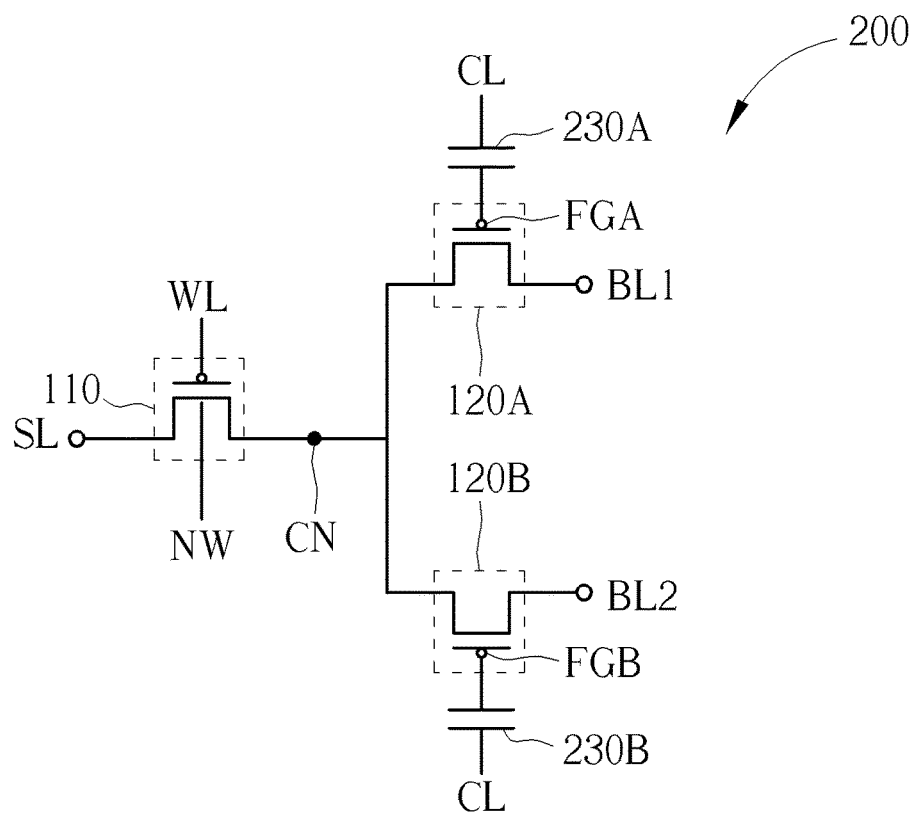
FIG. 2 shows a random bit cell according to another embodiment of the present invention.

FIG. 2 shows a random bit cell 200 according to one embodiment of the present invention. The random bit cells 100 and 200 have similar structure and can be operated with similar principles. However, the random bit cell 200 can further include control elements 230A and 230B. The control element 230A has a first terminal coupled to a control line CL, and a second terminal coupled to the floating gate FGA of the P-type transistor 120A. Also, the control element 230B has a first terminal coupled to the control line CL, and a second terminal coupled to the floating gate FGB of the P-type transistor 120B.

Figure 3:
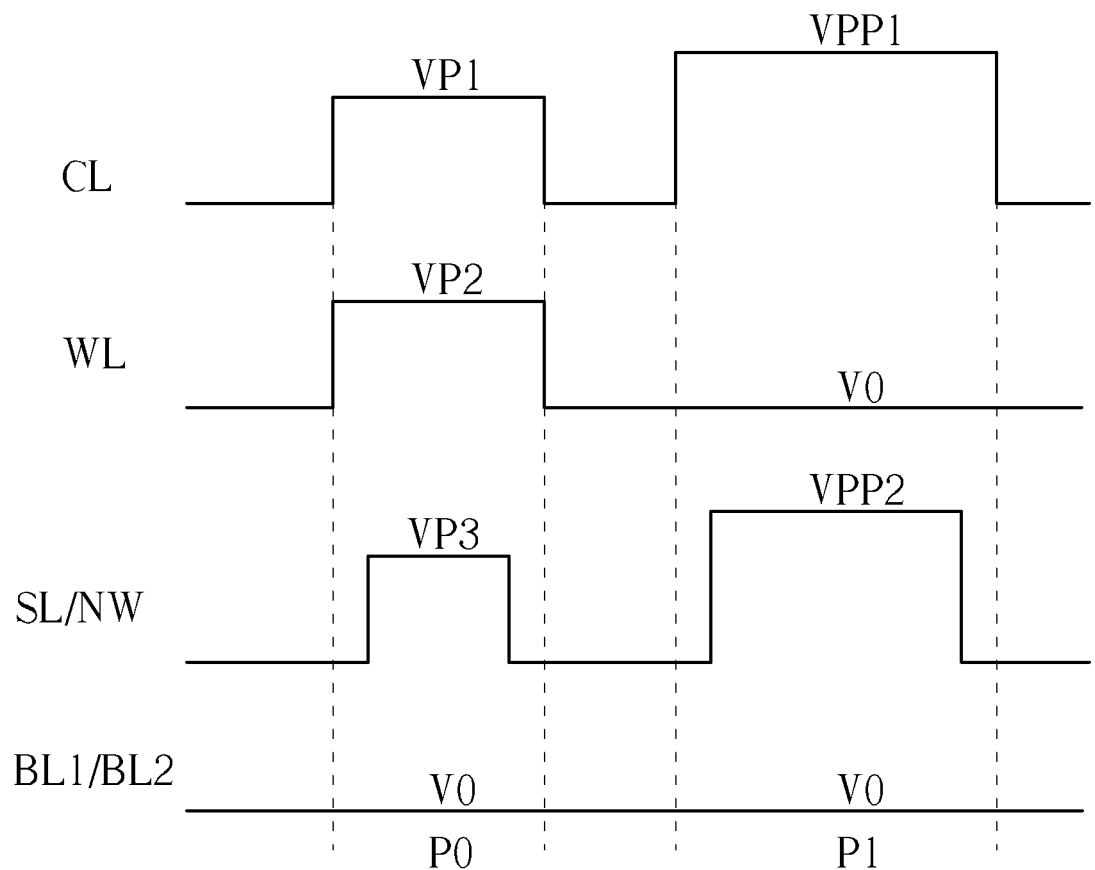
FIG. 3 shows the voltages received by the random bit cell in FIG. 2 during the enroll operation.

In some embodiments, the control elements 230A and 230B can be capacitive elements, and can be used to control the voltages of the floating gates of the P-type transistors 120A and 120B. FIG. 3 shows the voltages received by the random bit cell 200 during the enroll operation.

In FIG. 3, during a programming phase P1 of the enroll operation, the control line CL can be at a first program voltage VPP1, and the source line SL can be changed to a second program voltage VPP2 for a period of time. For example, in FIG. 3, the source line SL can be changed to the second program voltage VPP2 after the control line CL is set to the first program voltage VPP1, and can be changed later while the control line CL maintains at the first program voltage VPP1. In some embodiments, the first program voltage VPP1 and the second program voltage VPP2 can be high voltages capable of inducing the channel electron injection. Furthermore, in some embodiments, the first program voltage VPP1 and the second program voltage VPP2 can be, for example but not limited to, similar voltages or the same voltage.

Also, the word line WL, the bit lines BL1 and BL2 are at the reference voltage V0. In this case, during the programming phase P1, the floating gates FGA and FGB of the P-type transistors 120A and 120B can be coupled to the first program voltage VPP1 through the control elements 230A and 230B, and the channel hot electron injection can be induced on one of the P-type transistors 120A and 120B.

In some embodiments, since the voltages applied to the random bit cell 200 during the programming phase P1 are pretty high, it is possible that the high voltages may induce the channel hot electron injection on both the P-type transistors 120A and 120B, resulting in confusion to the random bit represented by the programming states. To prevent this issue, a pre-programming phase P0 can be performed before the programming phase P1 during the enroll operation as shown in FIG. 3.

During the pre-programming phase P0, the control line CL is at a first pre-program voltage VP1, the word line WL is at a second pre-program voltage VP2, and the bit lines BL1 and BL2 are at the reference voltage V0. Also, the source line SL and the N-well NW can be changed to a third pre-program voltage VP3 for a period of time during the pre-programming phase P0. For example, in FIG. 3, the source line SL can be changed to the third pre-program voltage VP3 after the control line CL is set to the first pre-program voltage VP1, and can be changed to the reference voltage V0 later while the control line CL maintains at the first pre-program voltage VP1.

In some embodiments, the first program voltage VPP1 is greater than the first pre-program voltage VP1, the first pre-program voltage VP1 is greater than the second pre-program voltage VP2, and the second pre-program voltage VP2 is greater than the reference voltage V0. Also, the third pre-program voltage VP3 and the first pre-program voltage VP1 can be, for example but not limited to, similar voltages or the same voltage. For example, the first program voltage VPP1 and the second program voltage VPP2 can be 8V, the first pre-program voltage VP1 and the third pre-program voltage VP3 can be 7V, and the second pre-program voltage VP2 can be 6V.

Since the voltages applied to the random bit cell 200 during the pre-programming phase P0 are smaller than those applied during the programming phase P1, the channel hot electron injection can be induced in a moderate pace. Therefore, the cases that the P-type transistors 120A and 120B are programmed at the same time due to the high-voltage condition can be reduced. In some embodiments, the pre-programming phase P0 of the enroll operation can be shorter than the programming phase P1 of the enroll operation.

In some embodiments, the pre-programming phase P0 can induce the channel hot electron injection to program one of the P-type transistors 120A and 120B, and the programming phase P1 can help to further program the programmed P-type transistor so that the programming states of the P-type transistors 120A and 120B can be further distinguished.

In some embodiments, the pre-programming phase P0 may be performed with different voltage arrangement according to the system requirement. Furthermore, if the condition permits in some embodiments, the pre-programming phase P0 can be omitted, and the enroll operation can be performed only with the programming phase P1. Furthermore, in some embodiments, the programming phase P1 can be performed in a ramping manner. In this case, during the programming phase P1, the source line SL and the N-well NW can be at the second program voltage VPP2, and the word line WL can be at the reference voltage V0. Also, the control line CL can be changed to the first program voltage VPP1 after the source line SL is set to the second program voltage VPP2. That is, the programming phase P1 can induce the channel hot electron injection with a gentler start. In some embodiments, the source line SL and the N-well NW can be changed to the reference voltage V0 during the programming phase P1 after the control line CL is changed to the first program voltage VPP1 for a period of time.

Figure 4:
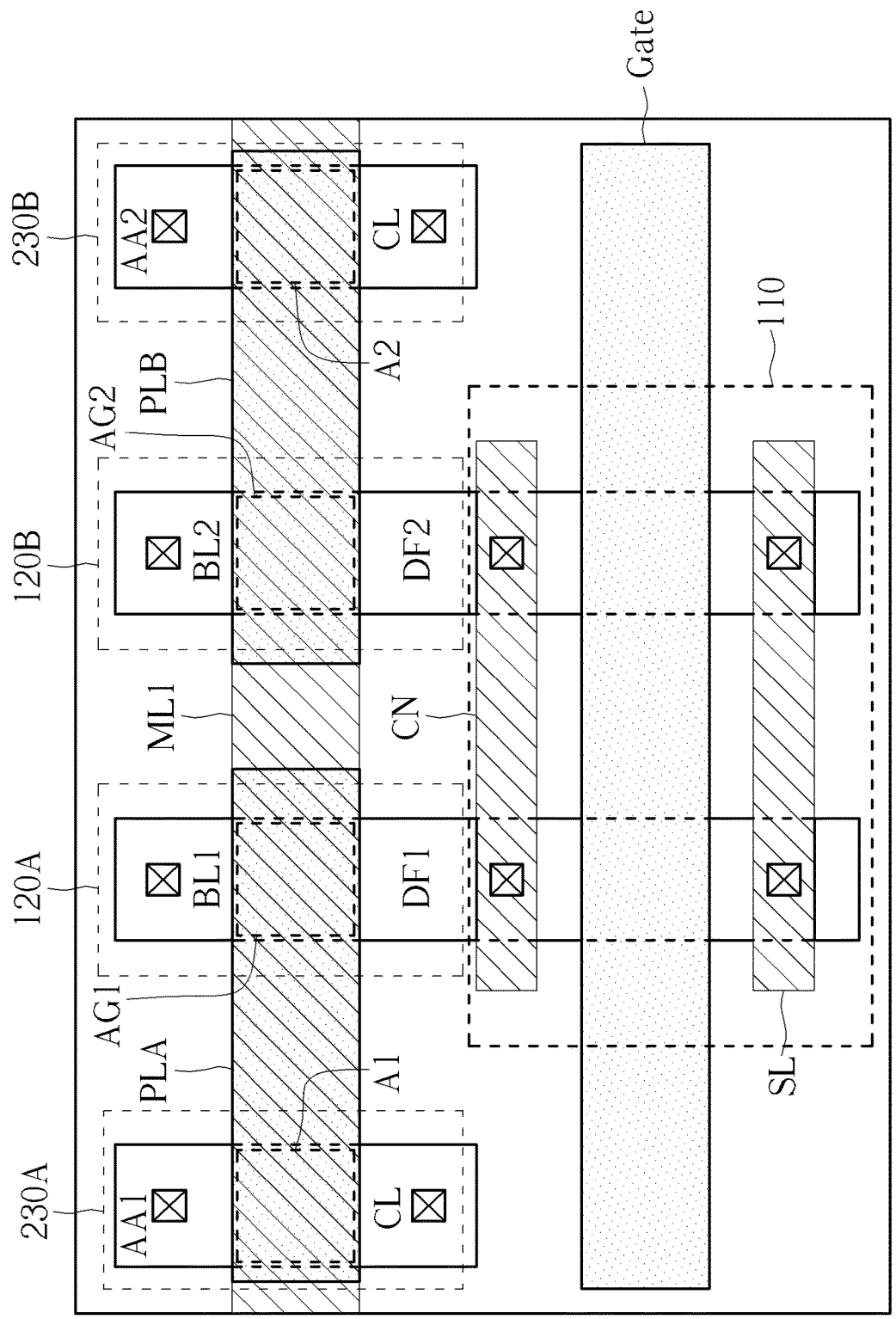
FIG. 4 shows a layout of the random bit cell in FIG. 2 according to one embodiment of the present invention.

FIG. 4 shows a layout of the random bit cell 200 according to one embodiment of the present invention. In FIG. 4, the floating gates of the P-type transistor 120A and the second terminal of the control element 230A can be coupled through the same polysilicon layer PLA, and the floating gates of the P-type transistor 120B and the second terminal of the control element 230B can be coupled through the same polysilicon layer PLB. Also, the random bit cell 200 can further include a metal layer ML disposed above the floating gates of the P-type transistors 120A and 120B. In some embodiments, the metal layer ML can be floating or can be used to transmit voltages of the system. In this case, since the metal layer ML can cover the floating gates of the P-type transistors 120A and 120B, it can also block the ultraviolet (UV) light so as to protect the P-type transistors 120A and 120B from being affected externally.

In some embodiments, to obtain the random bit with good randomness, the structure of the random bit cell 200 must be symmetrical. Therefore, in FIG. 4, the selection transistor 110 can be implemented by two transistors coupled in parallel. That is, these two transistors and the P-type transistors 120A and 120B can be implemented by the same two diffusion regions DF1 and DF2 with the diffusion regions DF1 and DF2 being coupled to the common node CN through a metal layer. Consequently, the uncontrollable factors that may affect the symmetry of the random bit cell 200 can be reduced. However, in some other embodiments, the selection transistor 110 can also be implemented by one single diffusion region according to the system requirement.

Furthermore, in FIG. 4, the coupling area A1 of the control element 230A can be defined by the area of the active region AA1 covered by the polysilicon layer PLA. Similarly, the coupling area A2 of the control element 230B can be defined by the area of the active region AA2 covered by the polysilicon layer PLB.

In some embodiments, if the coupling areas A1 and A2 of the control elements 230A and 230B are much larger than the coupling areas AG1 and AG2 of the floating gates of the P-type transistors 120A and 120B, then the voltages of the floating gates of the P-type transistors 120A and 120B will be dominated by the control elements 230A and 230B through the control line CL. For example, the coupling area A1 can be four times the coupling area AG1 of the floating gate of the P-type transistor 120A in some embodiments for having a stronger coupling effect.

However, in some embodiments, the coupling areas A1 and A2 of the control elements 230A and 230B may be designed to be smaller. For example, in FIG. 4, the coupling areas A1 and A2 of the control elements 230A and 230B can be substantially the same as the coupling areas AG1 and AG2 of the floating gates of the P-type transistors 120A and 120B. In this case, the coupling effect may be less significant, but the control elements 230A and 230B may be used for erasing the P-type transistors 120A and 120B as well. In some embodiments, by erasing the P-type transistors 120A and 120B, the random bit generated by the random bit cell 20 can be reset when the external threat comes, thereby improving the security of the system.

Figure 5:
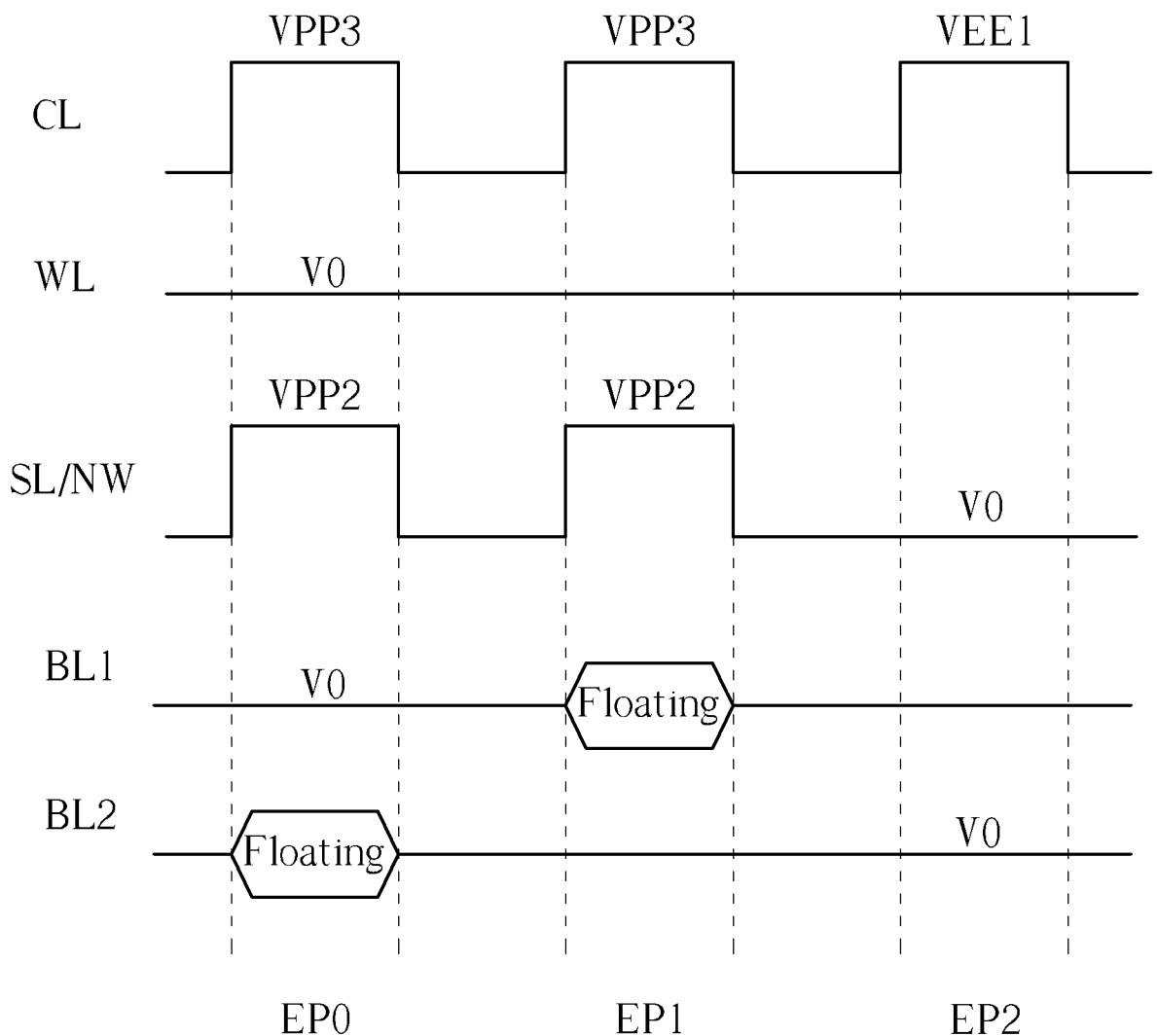
FIG. 5 shows the voltages received by the random bit cell in FIG. 2 during the reset operation.

FIG. 5 shows the voltages received by the random bit cell 200 during a reset operation. In FIG. 5 during an erasing phase EP2 of the reset operation, the source line SL, the N-well NW, the word line WL, the bit lines BL1 and BL2 are at the reference voltage V0, and the control line CL can be at an erase voltage VEE1. In some embodiments, the erase voltage VEE1 can be greater than the reference voltage V0. For example, the erase voltage VEE1 can be 12V.

During the erasing phase EP2, if the P-type transistor 120A has been programmed before, then the electrons stored in the floating gate of the P-type transistor 120A will be ejected through the control element 230A due to the erase voltage VEE1 applied to the control line CL. Therefore, the P-type transistor 120A can be erased.

However, in some embodiments, the erasing phase may also alter the condition of the non-programmed P-type transistor 120B. In this case, the conditions of the P-type transistors 120A and 120B may be different after the reset operation, and the randomness of the random bit cell 200 will be affected.

To address this issue, in FIG. 5, reprogramming phases EP0 and EP1 of the reset operation can be adopted before the erasing phase EP2. During the reprogramming phase EP0, the control line CL can be at a third program voltage VPP3, the source line SL and the N-well NW can be at the second program voltage VPP2 or even greater, and the word line WL can be at the reference voltage V0. Also, the bit line BL1 can be at the reference voltage V0 while the bit line BL2 can be floating.

In some embodiments, the purpose of performing the reprogramming phases EP0 and EP1 is to adjust the P-type transistors 120A and 120B to be in the similar conditions, for example, to have similar value of Ion current, (i.e. to store similar amounts of carriers) before the erasing phase EP2. In this case, the second program voltage VPP2 can be set higher and the third program voltage VPP3 can be half of the second program voltage VPP2. Consequently, the select transistor 110 can be fully turned on to build a stronger programming condition, and the P-type transistor 120A will be programmed in the reprogramming phase EP0.

During the reprogramming phase EP1, the control line CL can be at the third program voltage VPP3, the source line SL can be at the second program voltage VPP2, and the word line WL can be at the reference voltage V0. Also, the bit line BL2 can be at the reference voltage V0 while the bit line BL1 can be floating. That is, the P-type transistor 120B will be programmed in the reprogramming phase EP1.

Therefore, after the reprogramming phases EP0 and EP1, both of the P-type transistors 120A and 120B will be programmed, and the P-type transistors 120A and 120B will both be erased during the erasing phase EP2. Consequently, the conditions of the P-type transistors 120A and 120B would be quite similar after the reset operation, thereby preserving the randomness of the random bit cell 200.

Table 1 shows the voltages applied to the random bit cell 200 in the different phases during the reset operation.

|  | SL/NW | CL | WL | BL1 | BL2 |
| --- | --- | --- | --- | --- | --- |
| EP0 | VPP2 | VPP3 | V0 | V0 | Floating |
| EP1 | VPP2 | VPP3 | V0 | Floating | V0 |
| EP2 | V0 | VEE1 | V0 | V0 | V0 |

In some embodiments, the reprogramming phase EP0 may be performed to program the non-programmed P-type transistor, and the reprogramming phase EP1 can be omitted. That is, during the reprogramming phase EP0, if the P-type transistor 120A is determined to be not programmed while the P-type transistor 120B is determined to be programmed, then the control line CL can be at the third program voltage VPP3, the source line SL and the N-well NW can be at the second program voltage VPP2, the word line WL and the bit line BL1 can be at the reference voltage V0, and the bit line BL2 can be floating. In this case, the channel hot electron injection may only be induced on the floating gate of the P-type transistor 120A, and the non-programmed P-type transistor 120A will be programmed.

However, if the P-type transistor 120B is determined to be not programmed while the P-type transistor 120A is determined to be programmed, then the reprogramming phase EP0 will be performed to program the P-type transistor 120B. Consequently, the P-type transistors 120A and 120B will be in the similar conditions before the erasing phase EP2, and will both be erased during the erasing phase EP2.

In some embodiments, if the coupling areas A1 and A2 of the control elements 230A and 230B are designed to be even smaller, then erasing ability of the control elements 230A and 230B would be improved while the programming ability of the control elements 230A and 230B will be suppressed. That is, the sizes of the coupling areas A1 and A2 of the control elements 230A and 230B can be designed according to the system requirement.

Although the random bit cell 200 can use the control elements 230A and 230B to erase the P-type transistors 120A and 120B, the random bit cell 200 may also erase the P-type transistors by erase elements in some other embodiments.

Figure 6:
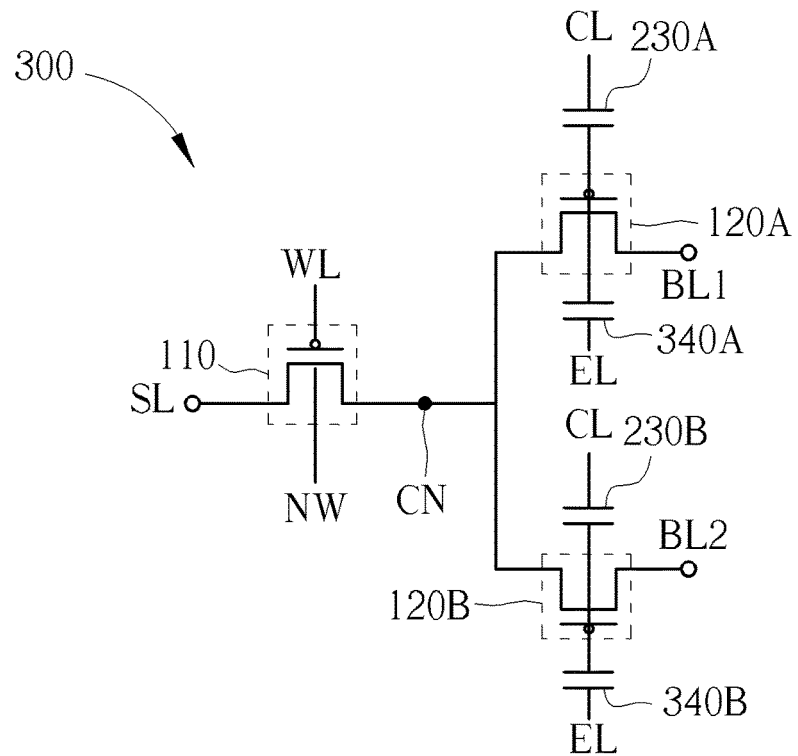
FIG. 6 shows a random bit cell according to another embodiment of the present invention.

FIG. 6 shows a random bit cell 300 according to another embodiment of the present invention. The random bit cells 200 and 300 have similar structures and can be operated with similar principles. However, the random bit cell 300 can further includes erase elements 340A and 340B.

The erase element 340A has a first terminal coupled to an erase line EL, and a second terminal coupled to the floating gate of the P-type transistor 120A, and the erase element 340B has a first terminal coupled to the erase line EL, and a second terminal coupled to the floating gate of the P-type transistor 120B.

In some embodiments, the coupling areas of the erase elements 340A and 340B can be smaller than the coupling areas of the floating gate of the P-type transistors 120A and 120B. For example, the coupling area of the floating gate of the P-type transistor 120A can be nine times the coupling area of the erase element 340A. In this case, the coupling areas of the control elements 230A and 230B can be designed to be much greater than the coupling areas of the floating gates of the P-type transistors 120A and 120B so the voltages of the floating gates of the P-type transistors 120A and 120B will be dominated by the control elements 230A and 230B. Also, with the smaller coupling areas, the erase elements 340A and 340B may not be able to dominate the voltages of the floating gates of the P-type transistors 120A and 120B, but would be suitable to erase the P-type transistors 120A and 120B by causing electron ejection from the floating gates.

That is, the random bit cell 300 can perform the enroll operation to program one of the P-type transistors 120A and 120B with the control elements 230A and 230B, and can perform the reset operation to erase the P-type transistor 120A and/or 120B with the erase elements 340A and 340B. With the specialized control elements 230A and 230B and the erase elements 340A and 340B, the enroll operation and the reset operation can be performed even more efficiently.

In some embodiments, during the erasing phase EP1 of the reset operation, the source line SL, the word line WL, and the bit lines BL1 and BL2 can be at the reference voltage V0 as shown in FIG. 5. However, the control line CL can be at the reference voltage V0 while the erase line EL can be at the erase voltage VEE. In this case, the electrons captured in the floating gates of the P-type transistors 120A and 120B would be ejected to through the erase elements 340A and 340B.

Furthermore, in some embodiments, the erase elements 340A and 340B may also be used to assist the control elements 230A and 230B to program the P-type transistors 120A and 120B. For example, during the programming phase P1 of the enroll operation as shown in FIG. 3, the control line CL and the erase line EL can both be at the first program voltage VPP1.

Figure 7:
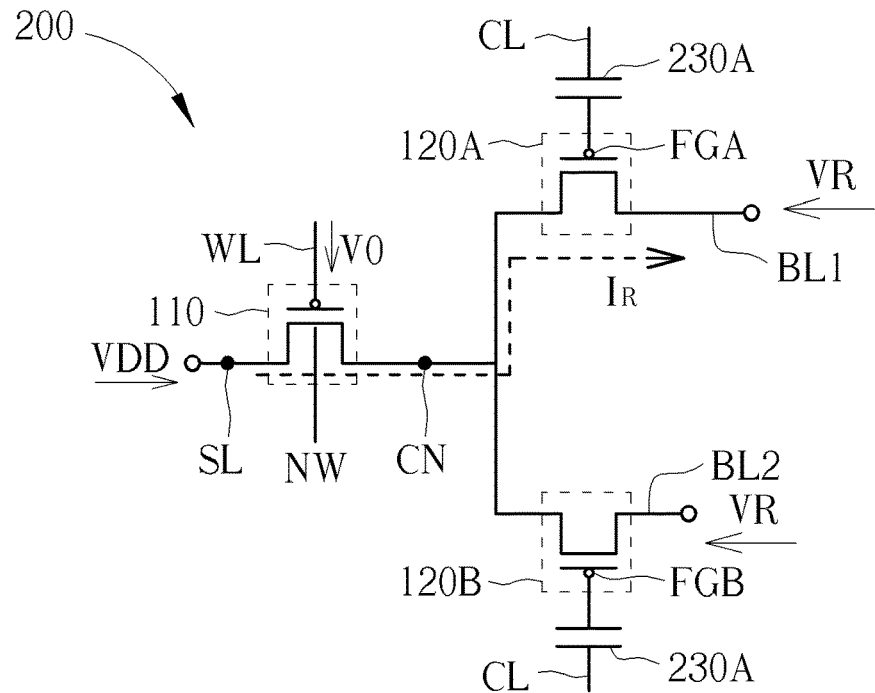
FIG. 7 shows the voltages received by the random bit cell in FIG. 2 during the read operation.

FIG. 7 shows the voltages received by the random bit cell 200 during a read operation. In FIG. 7, during the read operation, the source line SL is at an operation voltage VDD, and the word line WL is at the reference voltage V0. Also, the bit lines BL1 and BL2 can be pre-charged to a read voltage VR. In some embodiments, the operation voltage VDD can be greater than the read voltage VR. For example, the operation voltage VDD can be 2V and the read voltage VR can be 0.4V.

In this case, if the P-type transistor 120A has been programmed, then the reading current $I_R$ would be generated from the source line SL to the bit line BL1. However, if the P-type transistor 120A has not been programmed, then no current or only an insignificant current will be sensed. In some embodiments, during the read operation after the bit lines BL1 and BL2 are pre-charged, the bit lines BL1 and BL2 can be coupled to a sense amplifier to sense the read current. By sensing the currents on the bit line BL1 and/or the bit line BL2, the random bit stored in the random bit cell 200 can be read. In some embodiments, the currents on the bit lines BL1 and BL2 can be sensed in a differential manner. However, since there should be only one P-type transistor being programmed after the enroll operation, normally the programming states of the P-type transistors 120A and 120B should be different. Therefore, in some other embodiments, the sense amplifier can determine the random bit by sensing only the current on the bit line BL1 or the current on bit line BL2.

In some embodiments, if the system needs to generate a plurality of random bits, then a random bit array may be formed. In this case, a plurality of random bit cells 200 may be coupled to the same bit lines BL1 and BL2. However, since the P-type transistors 120A and 120B of the random bit cell 200 are coupled to the same common node CN, the bit line BL1 may be coupled to the BL2 through the P-type transistors 120A and 120B and the common nodes CN of different random bit cells 200 coupled to the same bit lines BL1 and BL2. Consequently, the margin of the reading currents for determining the programming states may be narrowed, thereby increasing the required time for the read operation.

Figure 8:
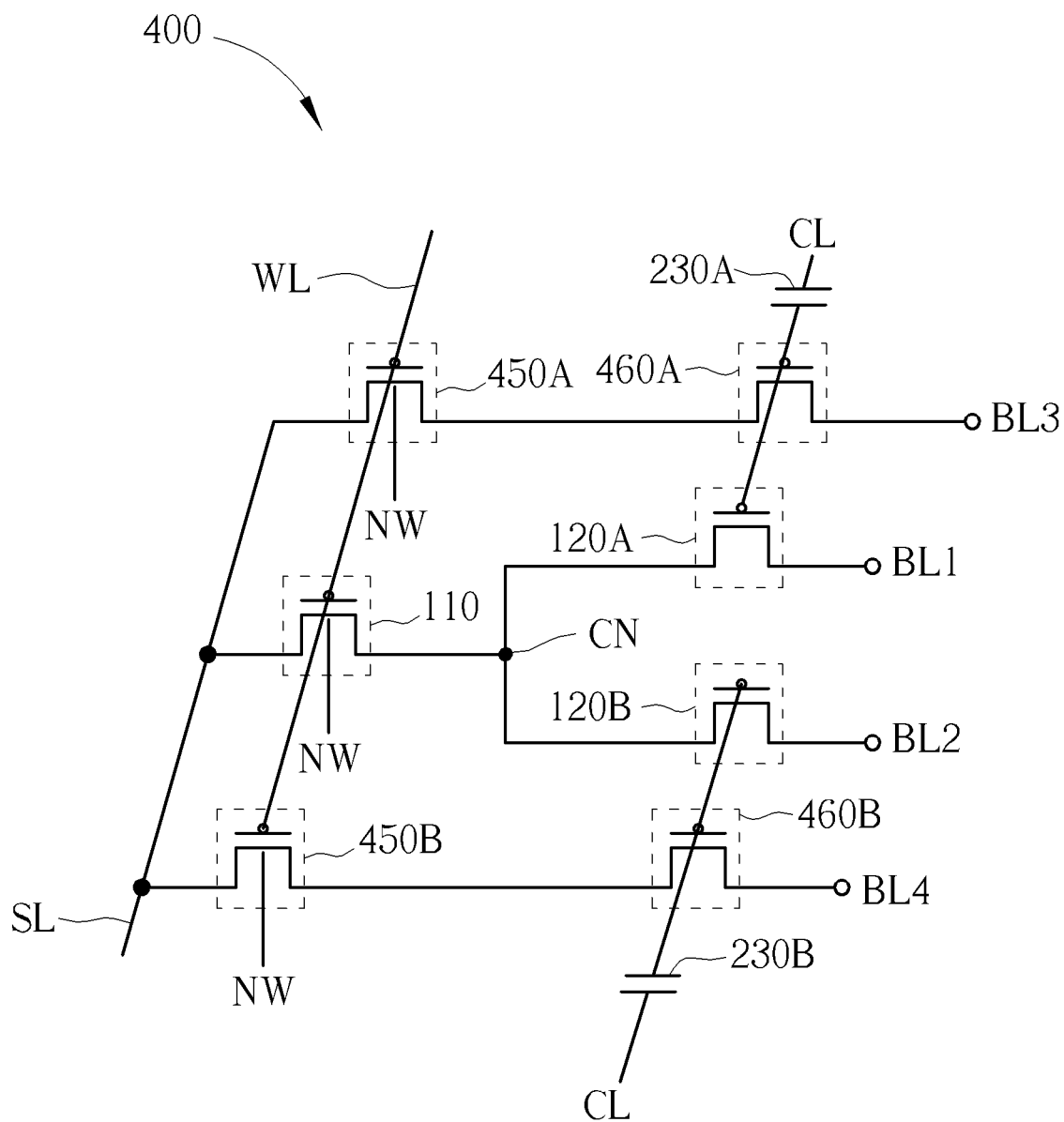
FIG. 8 shows a random bit cell according to another embodiment of the present invention.

To address this issue, the random bit cell may further include more transistors for controlling the read operation. FIG. 8 shows a random bit cell 400 according to one embodiment of the present invention.

The random bit cells 200 and 400 have similar structures and can be operated with similar principles. However, the random bit cell 400 further includes selection transistors 450A and 450B, and P-type transistors 460A and 460B.

The selection transistor 450A has a first terminal coupled to the source line SL, a second terminal, and a control terminal coupled to the word line WL. The P-type transistor 460A has a first terminal coupled to the second terminal of the selection transistor 450A, a second terminal coupled to a bit line BL3, and a floating gate coupled to the floating gate of the P-type transistor 120A.

The selection transistor 450B has a first terminal coupled to the source line SL, a second terminal, and a control terminal coupled to the word line WL. The P-type transistor 460B has a first terminal coupled to the second terminal of the selection transistor 450B, a second terminal coupled to a bit line BL4, and a floating gate coupled to the floating gate of the P-type transistor 120B.

In some embodiments, the voltages applied in the enroll operation and the reset operation of the random bit cell 200 can also be applied to the random bit cell 400 to perform the corresponding operations. However, the random bit cell 400 can perform the read operation with the selection transistors 450A and 450B, and P-type transistors 460A and 460B.

Figure 9:
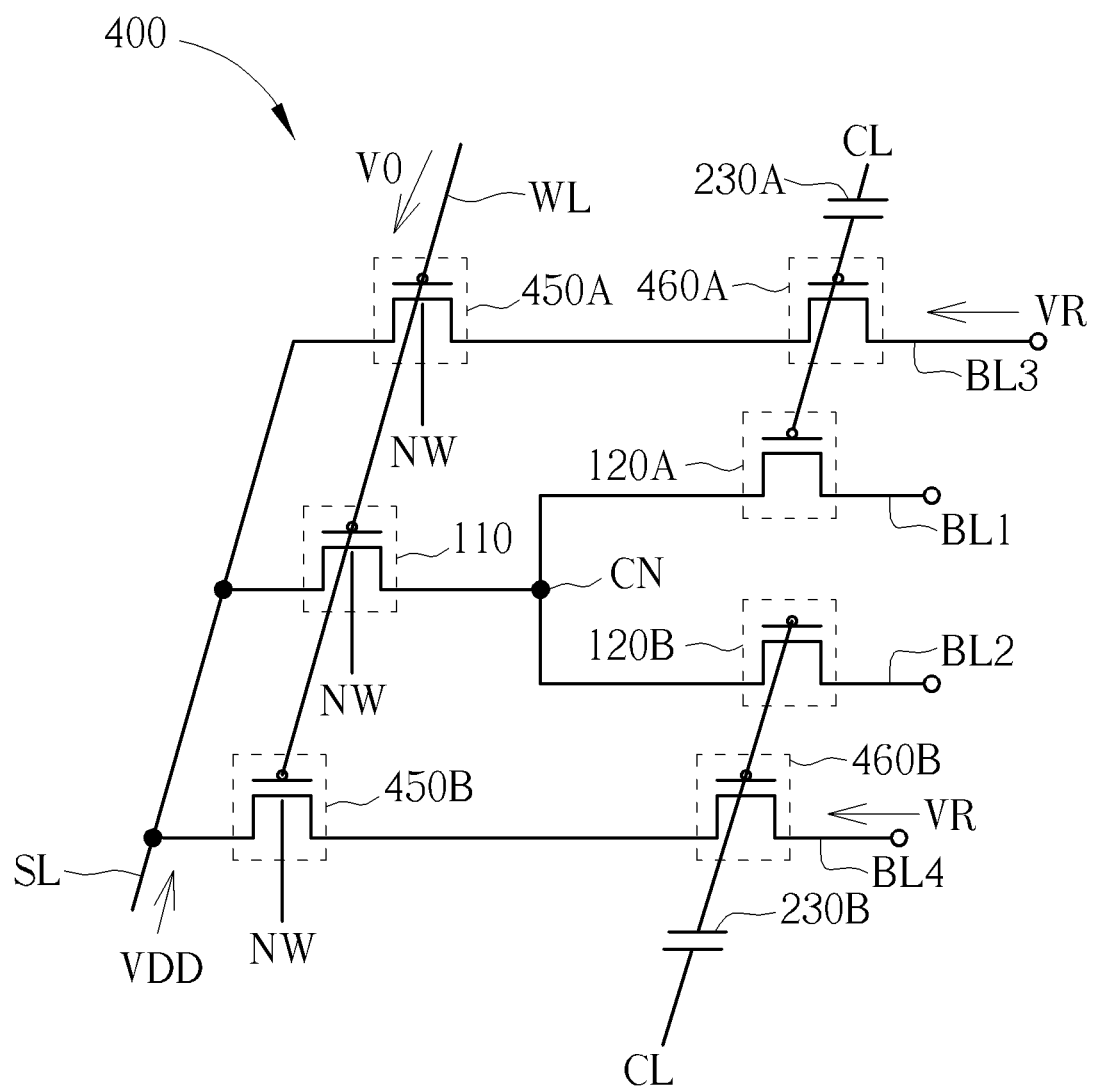
FIG. 9 shows the voltages received by the random bit cell in FIG. 8 during the read operation.

FIG. 9 shows the voltages received by the random bit cell 400 during the read operation. In FIG. 9, during the read operation, the source line SL is at the operation voltage VDD, and the word line WL is at the reference voltage V0. Also, the floating gates of the P-type transistor 120A, 120B, 460A, and 460B are floating. Furthermore, the bit lines BL3 and BL4 can be pre-charged to the read voltage VR, and the sense amplifier can be coupled to the bit lines BL3 and BL4 for sensing the reading current. Since the P-type transistors 460A and 460B are not coupled to the same common node CN, the bit lines BL3 and BL4 will not be coupled together through other random bit cells. Therefore, the margin of the reading currents for determining the programming states can be preserved, thereby shortening the required time for the read operation.

Figure 10:
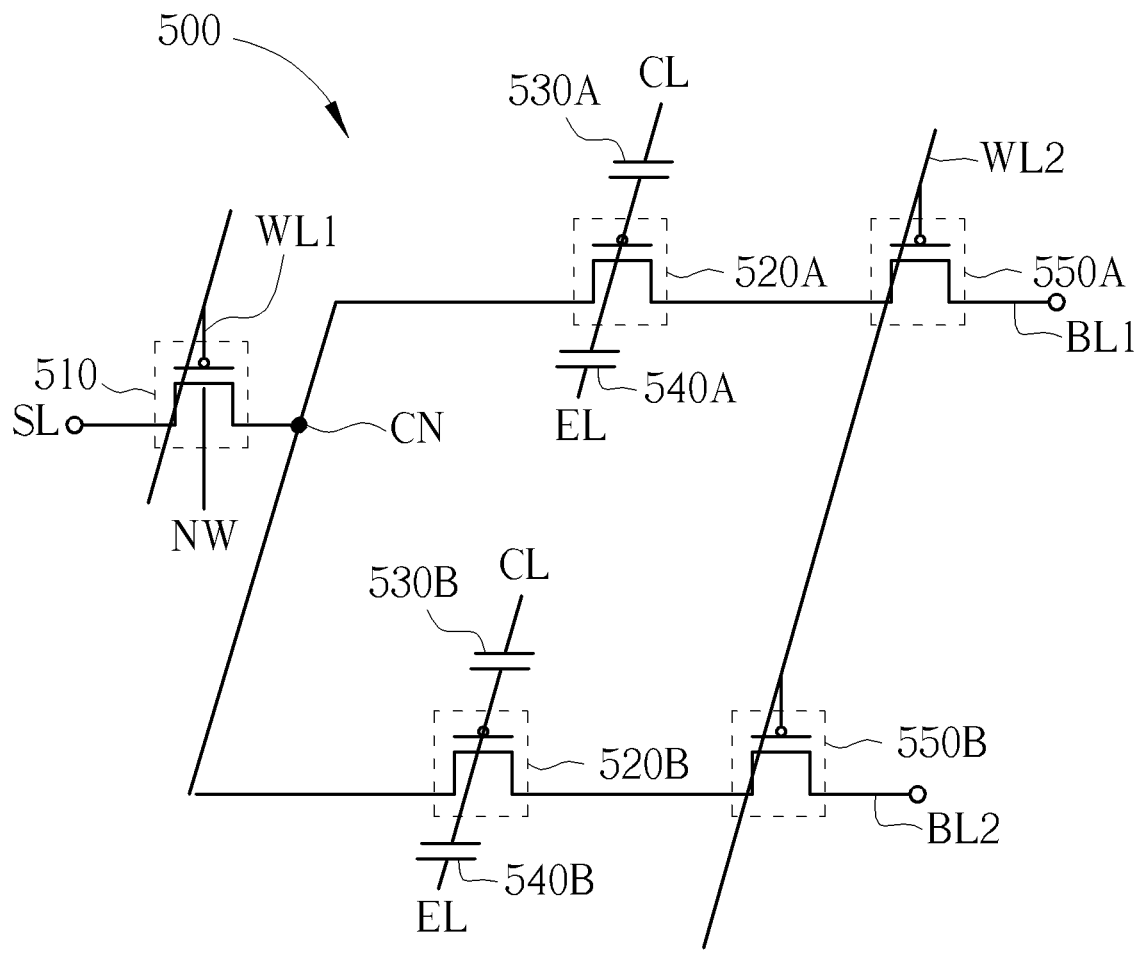
FIG. 10 shows a random bit cell according to another embodiment of the present invention.

FIG. 10 shows a random bit cell 500 according to one embodiment of the present invention. The random bit cell 500 includes a selection transistor 510, P-type transistors 520A and 520B, and isolation transistors 550A and 550B. The selection transistor 510 has a first terminal coupled to the source line SL, a second terminal coupled to the common node CN, and a control terminal coupled to the word line WL1. The P-type transistor 520A has a first terminal coupled to the common node CN, a second terminal, and a floating gate, and the P-type transistor 520B has a first terminal coupled to the common node CN, a second terminal, and a floating gate. The isolation transistor 550A has a first terminal coupled to the second terminal of the P-type transistor 520A, a second terminal coupled to the bit line BL1, and a control terminal coupled to the word line WL2. The isolation transistor 550B has a first terminal coupled to the second terminal of the P-type transistor 520B, a second terminal coupled to the bit line BL2, and a control terminal coupled to the word line WL2. In FIG. 10, the selection transistor 510 and the isolation transistors 550A, and 550B can be are P-type transistors, however, in some other embodiments, the selection transistor 510 and the isolation transistors 550A, and 550B can also be N-type transistors.

In addition, in FIG. 10, the random bit cell 500 can further include control elements 530A and 530B, and erase elements 540A and 540B. The control element 530A has a first terminal coupled to the control line CL, and a second terminal coupled to the floating gate of the P-type transistor 520A. The control element 530B has a first terminal coupled to the control line CL, and a second terminal coupled to the floating gate of the P-type transistor 520B.

The erase element 540A has a first terminal coupled to the erase line EL, and a second terminal coupled to the floating gate of the P-type transistor 520A. The erase element 540B has a first terminal coupled to the erase line EL, and a second terminal coupled to the floating gate of the P-type transistor 520B.

In some embodiments, the voltages applied to the random bit cell 300 for performing the enroll operation and the reset operation can be applied to the random bit cell 500 with the isolation transistor 550A and 550B being turned on.

Also, the during the read operation, the source line SL can be at the operation voltage VDD, the word lines WL1 and WL2 can be at the reference voltage V0. The bit lines BL1 and BL2 can be coupled to the sense amplifier for sensing the read current after being pre-charged. However, when the random bit cell 500 is not selected to perform the read operation, the word line WL2 can be at the operation voltage VDD. That is, when the random bit cell 500 is not selected, the isolation transistor 550A and 550B can be turned off, preventing the currents induced by the P-type transistors 520A and 520B of the unselected random bit cell from flowing to the bit lines BL1 and BL2. Consequently, the margin of the reading currents for determining the programming states can be preserved.

In summary, the random bit cells provided by the embodiments of the present invention can generate random bits with P-type transistors manufactured by regular processes. Therefore, the random bit cells can be implemented flexibly and can even be embedded with the memory device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A random bit cell comprising:
   a selection transistor having a first terminal coupled to a source line, a second terminal coupled to a common node, and a control terminal coupled to a word line;
   a first P-type transistor having a first terminal coupled to the common node, a second terminal coupled to a first bit line, and a floating gate; and
   a second P-type transistor having a first terminal coupled to the common node, a second terminal coupled to a second bit line, and a floating gate;
   wherein during an enroll operation, one of the first P-type transistor and the second P-type transistor is programmed and a random bit is determined accordingly.
2. The random bit cell of claim 1, further comprising:
   a first control element having a first terminal coupled to a control line, and a second terminal coupled to the floating gate of the first P-type transistor; and a second control element having a first terminal coupled to the control line, and a second terminal coupled to the floating gate of the second P-type transistor.

3. The random bit cell of claim 2, wherein during a programming phase of the enroll operation:
the control line is at a first program voltage;
the source line is at a second program voltage; and
the first bit line and the second bit line are at a reference voltage;
wherein the first program voltage and the second program voltage are greater than the reference voltage.

4. The random bit cell of claim 3, wherein
during the programming phase of the enroll operation:
the source line is changed to the second program voltage after the control line is set to the first program voltage.

5. The random bit cell of claim 3, wherein during a pre-programming phase of the enroll operation before the programming phase of the enroll operation:
the control line is at a first pre-program voltage;
the word line is at a second pre-program voltage; and
the source line is at a third pre-program voltage;
the first bit line and the second bit line are at the reference voltage;
wherein:
the first program voltage is greater than the first pre-program voltage, the second pre-program voltage, and the third pre-program voltage; and
the first pre-program voltage, the second pre-program voltage, and the third pre-program voltage are greater than the reference voltage.

6. The random bit cell of claim 5, wherein the pre-programming phase of the enroll operation is shorter than the programming phase of the enroll operation.

7. The random bit cell of claim 2, wherein during an erasing phase of a reset operation:
the source line, the word line, the first bit line and the second bit line are at a reference voltage; and
the control line is at an erase voltage;
wherein the erase voltage is greater than the reference voltage.

8. The random bit cell of claim 7, wherein during a reprogramming phase of the reset operation before the erasing phase:
if the first P-type transistor is determined to be not programmed:
the source line is at a second program voltage;
the control line is at a third program voltage;
the word line and the first bit line are at the reference voltage; and
the second bit line is floating;
wherein the second program voltage is greater than the third program voltage, and the third program voltage is greater than the reference voltage.

9. The random bit cell of claim 7, wherein:
during a first reprogramming phase of the reset operation before the erasing phase:
the source line is at a second program voltage;
the control line is at a third program voltage;
the word line and the first bit line are at the reference voltage; and
the second bit line is floating; and
during a second reprogramming phase of the reset operation before the erasing phase:
the source line is at the second program voltage;
the control line is at the third program voltage;
the word line and the second bit line are at the reference voltage; and
the first bit line is floating;
wherein the second program voltage is greater than the third program voltage, and the third program voltage is greater than the reference voltage.

10. The random bit cell of claim 2, further comprising:
a first erase element having a first terminal coupled to an erase line, and a second terminal coupled to the floating gate of the first P-type transistor; and
a second erase element having a first terminal coupled to the erase line, and a second terminal coupled to the floating gate of the second P-type transistor.

11. The random bit cell of claim 10, wherein during an erasing phase of a reset operation:
the source line, the word line, the first bit line and the second bit line are at a reference voltage; and
the erase line is at an erase voltage;
wherein the erase voltage is greater than the reference voltage.

12. The random bit cell of claim 11, wherein during a reprogramming phase of the reset operation before the erasing phase:
if the first P-type transistor is determined to be not programmed:
the source line is at a second program voltage;
the control line is at a third program voltage;
the word line and the first bit line are at the reference voltage; and
the second bit line is floating;
wherein the second program voltage is greater than the third program voltage, and the third program voltage is greater than the reference voltage.

13. The random bit cell of claim 11, wherein:
during a first reprogramming phase of the reset operation before the erasing phase:
the source line is at a second program voltage;
the control line and the erase line are at a third program voltage;
the word line and the first bit line are at the reference voltage; and
the second bit line is floating; and
during a second reprogramming phase of the reset operation before the erasing phase:
the source line is at the second program voltage;
the control line and the erase line are at the third program voltage;
the word line and the second bit line are at the reference voltage; and
the first bit line is floating;
wherein the second program voltage is greater than the third program voltage, and the third program voltage is greater than the reference voltage.

14. The random bit cell of claim 1, wherein during a read operation:
the source line is at an operation voltage;
the word line is at a reference voltage; and
at least one of the first bit line and the second bit line is coupled to a sense amplifier;
wherein the operation voltage is greater than the reference voltage.

15. The random bit cell of claim 1, further comprising:
a first isolation transistor having a first terminal coupled to the source line, a second terminal, and a control terminal coupled to the word line;
a third P-type transistor having a first terminal coupled to the second terminal of the first isolation transistor, a second terminal coupled to a third bit line, and a floating gate coupled to the floating gate of the first P-type transistor;

a second isolation transistor having a first terminal coupled to the source line, a second terminal, and a control terminal coupled to the word line; and a fourth P-type transistor having a first terminal coupled to the second terminal of the second isolation transistor, a second terminal coupled to a fourth bit line, and a floating gate coupled to the floating gate of the second P-type transistor.

16. The random bit cell of claim 15, wherein during a read operation:

the source line is at an operation voltage;

the word line is at a reference voltage;

at least one of the third bit line and the fourth bit line is coupled to a sense amplifier; and wherein the operation voltage is greater than the reference voltage.

17. The random bit cell of claim 1, wherein the selection transistor is an N-type transistor or a P-type transistor.

18. The random bit cell of claim 1 further comprising a metal layer disposed above the floating gate of the first P-type transistor and the floating gate of the second P-type transistor.

19. A random bit cell comprising:

a selection transistor having a first terminal coupled to a source line, a second terminal coupled to a common node, and a control terminal coupled to a first word line;

a first P-type transistor having a first terminal coupled to the common node, a second terminal, and a floating gate;

a second P-type transistor having a first terminal coupled to the common node, a second terminal, and a floating gate;

a first isolation transistor having a first terminal coupled to the second terminal of the first P-type transistor, a second terminal coupled to a first bit line, and a control terminal coupled to a second word line; and a second isolation transistor having a first terminal coupled to the second terminal of the second P-type transistor, a second terminal coupled to a second bit line, and a control terminal coupled to the second word line;

wherein during an enroll operation, one of the first P-type transistor and the second P-type transistor is programmed and a random bit is determined accordingly.

20. The random bit cell of claim 19, wherein the selection transistor, the first isolation transistor and the second isolation transistor are N-type transistors or P-type transistors.

21. The random bit cell of claim 19, further comprising:

a first control element having a first terminal coupled to a control line, and a second terminal coupled to the floating gate of the first P-type transistor; and a second control element having a first terminal coupled to the control line, and a second terminal coupled to the floating gate of the second P-type transistor.

22. The random bit cell of claim 21, further comprising:

a first erase element having a first terminal coupled to an erase line, and a second terminal coupled to the floating gate of the first P-type transistor; and a second erase element having a first terminal coupled to the erase line, and a second terminal coupled to the floating gate of the second P-type transistor.

23. The random bit cell of claim 19, wherein during a read operation:

the source line is at an operation voltage;

the first word line and the second word line are at a reference voltage; and at least one of the first bit line and the second bit line is coupled to a sense amplifier;

wherein the operation voltage is greater than the reference voltage.

24. The random bit cell of claim 19, wherein when the random bit cell is not selected, the first and second isolation transistors are turned off.

* * * * *